United States Patent

Harwood et al.

[11] Patent Number: 5,157,781
[45] Date of Patent: Oct. 20, 1992

[54] DATA PROCESSOR TEST ARCHITECTURE

[75] Inventors: Wallace B. Harwood; Mark W. McDermott, both of Austin; Dennis K. Verbeek, Round Rock, all of Tex.

[73] Assignee: Motorola, Inc., Schaumburg, Ill.

[21] Appl. No.: 459,484

[22] Filed: Jan. 2, 1990

[51] Int. Cl.⁵ .............................................. G06F 1/00
[52] U.S. Cl. ................................... 395/575; 371/22.3
[58] Field of Search .................. 364/200 MS File; 371/11.3, 22.6, 22.1, 19, 22.3

[56] References Cited

U.S. PATENT DOCUMENTS

| | | | |
|---|---|---|---|
| 3,415,981 | 12/1968 | Callahan et al. | 371/19 |
| 3,562,716 | 2/1971 | Fontaine et al. | 371/11.3 |
| 4,245,307 | 1/1981 | Kapeghian et al. | 364/200 |
| 4,315,313 | 2/1982 | Armstrong et al. | 371/19 |
| 4,384,322 | 5/1983 | Bruce et al. | 364/200 |
| 4,385,382 | 5/1983 | Goss et al. | 370/96 |
| 4,488,299 | 12/1984 | Fellhauer et al. | 371/22.1 |
| 4,489,414 | 12/1984 | Titherley | 371/22.1 |
| 4,622,669 | 11/1986 | Pri-Tal | 371/16.1 |
| 4,797,885 | 1/1989 | Orimo et al. | 371/19 |
| 4,816,997 | 3/1989 | Scales, III et al. | 364/200 |
| 4,857,348 | 8/1989 | Sukemura | 371/22.1 |

OTHER PUBLICATIONS

"A Universal Test and Maintenance Controller for Modules and Boards" by Lien et al, 1989 IEEE pp. 231-240.

Primary Examiner—Robert W. Beausoliel
Assistant Examiner—Phung My Chung
Attorney, Agent, or Firm—Robert L. King

[57] ABSTRACT

A test architecture in a data processing system having a plurality of circuit portions, coupled via a communication bus. In the system, a dedicated test register is placed in predetermined circuit portions which each can then operate in a normal mode and a test mode. A central processing unit (CPU) may initiate a test operation in any of the circuit portions in response to software executing by writing an operand to a centralized test module. Operands are scanned into and out of a circuit portion being tested while the central processing unit is capable of performing non-test processing activites. The CPU may also test itself using a dedicated test register which can only cause the CPU to enter a test mode after the register is written to.

8 Claims, 7 Drawing Sheets

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 0 | 0 | INCAD | TCR1C | ACUTR1 | ACUTR0 | 0 | 0 | SOSEL2 | SOSEL1 | SOSEL0 | SISEL2 | SISEL1 | SISEL0 | TMM |
| RESET: | | | | | | | | | | | | | | | |
| 0 | 0 | 0 | 0 | 0 | 0 | 0 | 0 | 0 | 0 | 0 | 0 | 0 | 0 | 0 | 0 |

FIG.6

| IDLE | NOLD-UPC | NMAC | SISEL | SOSEL | ACUTR | BIUTM |
|---|---|---|---|---|---|---|

DATA PROCESSOR TEST ARCHITECTURE

CROSS REFERENCE TO RELATED APPLICATIONS

Related subject matter is disclosed in the following applications assigned to the Assignee hereof:

1. U.S. application Ser. No. 07/431,121, entitled "A Data Processor Test Mode Access Method", filed Nov. 3, 1989 by Wallace B. Harwood.

2. U.S. application Ser. No. 07/425,082, entitled "Microprocessor Which Optimizes Bus Utilization Based Upon Bus Speed", filed Oct. 23, 1989 by Brad Burgess et al..

FIELD OF THE INVENTION

This invention relates to microcomputers with test features and more particularly to microcomputers with scan based testing and built-in self-testing.

BACKGROUND OF THE INVENTION

Testing of data processors has evolved as processors have become more and more complex. Initially processors, due to their lower transistor count design, could be effectively tested by running functional diagnostic programs. However, today's more advanced processors require that the testability be inherent in the design itself and that additional logic be incorporated into the processor solely to aid in testing.

When approaching how to test a processor, it should be assumed that the processor itself is designed correctly. Thus, in order to verify the proper manufacture of the processor, one need only verify the proper operation of the individual logic gates making up the processor. A known approach to testing a processor focuses upon a logic design that improves the ability to control the inputs of individual logic gates and observe the outputs of the individual logic gates. In this approach, stimulus patterns can easily be produced to test purely combinatorial logic, but it is much more difficult to generate patterns to adequately test sequential logic due to the existence of internal latches and/or feedback paths. In a complex microprocessor design the internal latches, state machines, and other design structures make writing test patterns very difficult. Some circuit designs also inherently have some logic gates that are not exercised except for a few special situations. Thus a fault can remain hidden unless a very special pattern of signals is presented to the circuitry.

Processors typically incorporate additional test circuitry to improve controllability and observability of the internal logic of the processor. Examples of such test circuitry include: (1) mechanisms for "dumping" the contents of a microcode read only memory (ROM), (2) logic for aiding in the testing of programmable logic array (PLA) structures, and (3) serial scan paths that provide access to internal logic blocks that are not otherwise easily accessible. The serial scan paths consist of a series of synchronously clocked master/slave latches, each of which is connected to various nodes within the circuit. The serial nature of these paths reduces the silicon area costs associated with testing, yet provides extended controllability and observation of nodes within the processor which are difficult to access.

The concept of serial scan has been extended in certain structured circuit design methodologies such that each gate within the design is controllable and observable. This type of structured design greatly enhances testability and simplifies the writing of test patterns, but adds significantly to the amount of circuitry required.

Typical testing of a data processor generally falls within two characterization categories: (1) functional testing and (2) structured testing. In functional testing, the microprocessor is operated in a normal mode by running a program which executes various instructions. In a production test environment, the program is provided by automatic test equipment (ATE) as inputs to the data processor, and the expected output results are verified by the tester. The processor can also verify its own operation by choosing an instruction sequence such that the results are known and are checked by the code itself. Functional testing requires careful selection of which instructions and operands to execute in order to verify a block of circuitry. Functional testing can be used to verify basic system operation, but it is very difficult to provide functional tests that can thoroughly verify a highly integrated data processor.

Structured testing, as previously discussed, involves the use of the internal features specifically designed to aid testability. These test features significantly modify the operation of internal logic blocks within the data processor in order to improve testability. During the use of such test features the normal operation of the processor is precluded, which may be disadvantageous.

Self-test is the ability of the processor, or system, to test itself and verify its own proper operation. Self-test of a central processor usually involves simple functional testing either from internal or external program memory. As an example of a processor with self-test ability, the MC68HC05, sold by Motorola Inc., executes a self-test program from internal ROM. Also, processors are known which have elaborate internal testing usually directed by special microcode. As an example, the 80386, sold by Intel Inc. functions under microcode control to perform internal testing.

SUMMARY OF THE INVENTION

It is an object of the present invention to provide an improved method and circuit for testing of a microprocessor.

In carrying out the above and other objects of the present invention there is provided a data processing system test architecture, and method of use, having a plurality of circuit portions coupled via a communication bus. At least one of the circuit portions operates in either a normal mode or in a test mode in response to a control signal. A test register is provided in each circuit portion which operates in both the normal and test modes. A bus master asserts control of the communication bus and provides the control signal. The data processor also comprises a test module. The test module controls testing of a predetermined one of the circuit modules in response to the control signal by controlling the test register of the predetermined circuit portion in order to perform a predetermined test. The bus master is able to continue testing processing activities after providing the control signal and concurrent with the controlling of the test register by the test module. In one form, the bus master may be implemented as a central processing unit which may also test itself.

These and other objects, features and advantages, will be more clearly understood from the following detailed description taken in conjunction with the accompanying drawings.

DETAILED DESCRIPTION OF THE INVENTION

The terms "assert" and "negate", and various grammatical forms thereof, are used herein to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state. Further, it should be well understood that when specific bit sizes are stated herein for purposes of illustration, such bit sizes are intended to be exemplary only.

Figure 1:
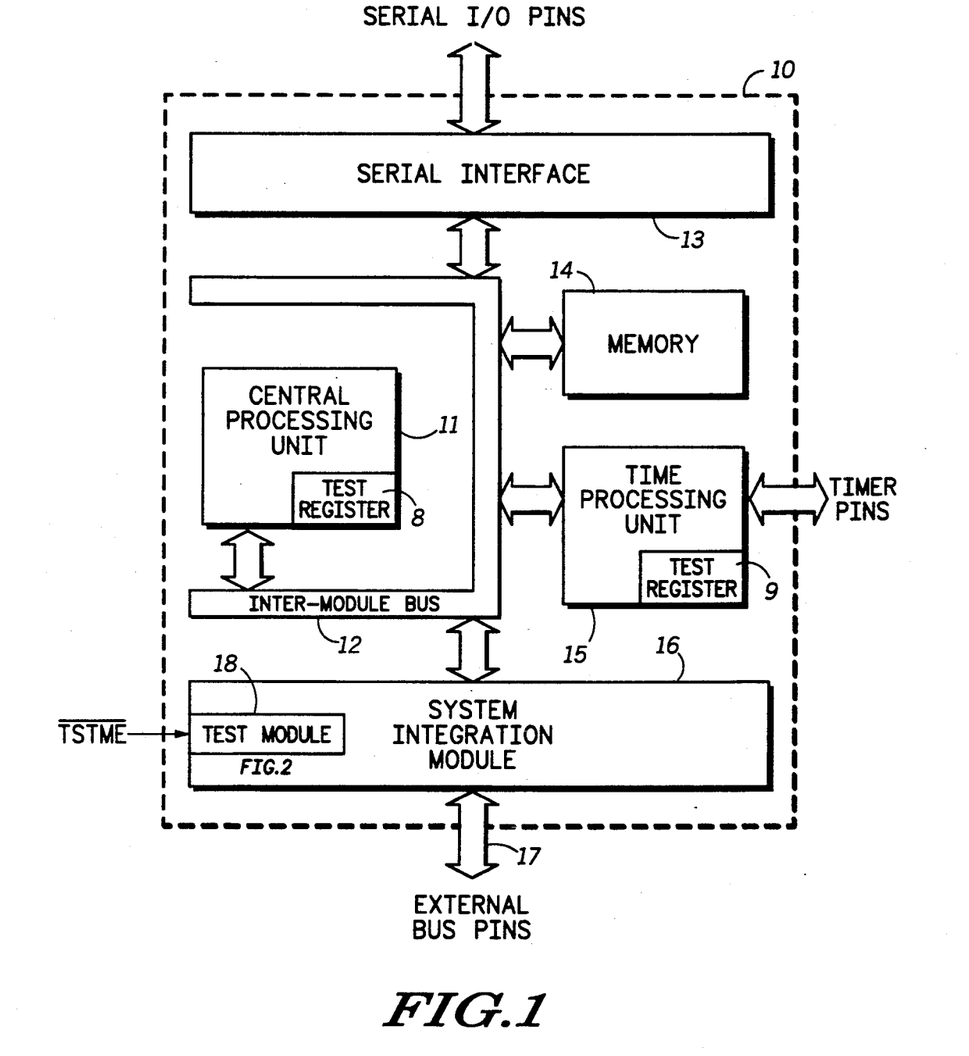
FIG. 1 is a block diagram of an integrated circuit microprocessor in accordance with the present invention.

Shown in FIG. 1 is a block diagram of microcomputer 10 in accordance with the present invention. Microcomputer 10, which is intended for manufacture as a single integrated circuit, generally comprises a central processing unit (CPU) 11, an Inter-Module Bus (IMB) 12, a serial interface 13, a memory module 14, a Time Processing Unit (TPU) 15 and a System Integration Module (SIM) 16. Each of CPU 11, serial interface 13, memory module 14, TPU 15 and SIM 16 is bi-directionally coupled to IMB 12 for the purpose of exchanging address, data and control information.

Serial interface 13 and TPU 15 are each coupled to a number of pins, or connectors, for communication with devices external to microcomputer 10. In addition, SIM 16 is coupled to a number of pins comprising an external bus 17 and to power supply and crystal oscillator pins. SIM 16 provides a mechanism for interfacing IMB 12 to the external bus 17 so that the CPU 11 can access external memory or peripheral devices. SIM 16 also provides a mechanism for interfacing the external bus 17 to IMB 12 so that an external bus master can access internal modules. This interfacing of external bus 17 to IMB 12 is referred to as a "slave mode".

The SIM 16 contains a test module 18 which has an input for receiving a signal labeled "$\overline{TSTME}$" and which supports both production testing and user self-testing for microcomputer 10. The test module 18 performs scan based testing of various modules within the system, and accesses modules via signal lines of IMB 12. Scan based testing involves serially scanning data through various "scan paths" within a Module Under Test (MUT) in order to more easily test internal circuitry. Scan paths are designed to provide additional control and visibility of complicated circuitry making it more easily tested as compared to just performing functional tests.

Each module typically incorporates a test register, such as test registers 8 and 9 respectively of CPU 11 and TPU 15 which is writeable only while in test mode. Such a test register is part of each module's memory map, is written to prior to scanning, and selects such features as either scan paths to use or additional test functions to be enabled during testing. Test register 9 of the TPU 15, for example, may control: (1) dumping of micro-ROM (not shown) inside TPU 15; (2) selecting external clocking for a time base counter (not shown) also within TPU 15; (3) allowing the TPU 15 to run one microcycle in response to the assertion of a signal line commonly referred to as "Activate Circuit Under Test" (ACUT) which is discussed below; (4) selecting of the TPU 15 input and output scan paths to be used during scanning; and (5) selecting which of two address maps the TPU 15 register set should reside in for address decode testing. A test register can be written to, while in test mode, by any IMB 12 master including the CPU 11 (i.e. for self-test) or an external master via slave mode (i.e. for production testing by an external tester, or for self-test under the direction of an external CPU).

Various features and operations of the test module 18 are restricted to operate only while in test mode. Test mode is controlled by the enable test mode (ETM) register bit in the test module 18 of SIM 16. Access to this ETM bit is restricted in that it can only be written to once following reset, and the bit can be asserted only if the external test mode enable pin $\overline{TSTME}$ is asserted. Furthermore, if while in test mode the $\overline{TSTME}$ pin becomes negated, a reset occurs which effectively brings the system to its normal, non-test mode operating state. The ETM bit of test module 18 is coupled to a predetermined bus conductor of IMB 12 and notifies other modules as to the status of test mode.

Scan testing within microcomputer 10 can be readily implemented thru the use of test registers. Testing is performed by configuring a MUT's test register for a particular test (i.e. selecting the scan paths to use and enabling particular test features). Test module 18 then serially scans into the module under test a particular stimulus pattern, activates the circuit under test, and scans out a resultant pattern. The stimulus pattern may be loaded into test module 18 by an IMB master (i.e. CPU or an external bus interface) and scanned sixteen bits at a time, or the pattern can be generated within the test module 18 by a pseudorandom pattern generator. For pseudorandom pattern generation an initial seed value is supplied by the IMB master. The activity to be performed during the "activate circuit under test" period is specified by the MUT's test register. The resultant pattern is scanned from the MUT to the test submodule and read by the IMB master sixteen bit at a time, or it may be compressed by the test module 18 using a serial signature analysis scheme. The IMB master would then read and verify the resultant signature. A signature analyzer implemented within test module 18 is typically supplied with an initial seed value which functions for initialization. When multiple tests are performed, the scan-in of the stimulus pattern of one test may be performed simultaneously with the scan-out of the resultant pattern of the previous test.

InterModule Bus (IMB) Signal Lines

A number of IMB 12 signal lines, labeled "IRQ-7–IRQ1", are used to facilitate communications between the test module 18 and the module under test. There are two dedicated IMB 12 signal lines used to control testing which receive two signals from test module 18. The first signal provided by test module 18, a Test Mode signal (TSTMOD) notifies all modules within the system that test mode has been enabled. The second signal provided by test module 18, an enable IMB Test lines signal (IMBTST), when asserted changes the functionality of seven interrupt signal lines of the IMB 12 signal lines into test lines. The IMB 12 interrupt signal lines (IRQ7-IRQ1) are precharge/discharge lines normally used to request interrupt service of the CPU. When IMBTST is asserted the IMB 12 interrupt signal lines are redefined to function as test signal lines as listed in the table below.

| Interrupt Signal line | Test Usage Description |
| --- | --- |
| IRQ 7 | SCANA (scan into MUT) |
| IRQ 6 | SCANB (scan out of MUT) |
| IRQ 5 | SCEA (Scan Clock Enable A) |
| IRQ 4 | SCEB (Scan Clock Enable B) |
| IRQ 3 | ACUT (Activate Circuit Under Test) |
| IRQ 2 | CPUTR (Scan CPU Test Register) |
| IRQ 1 | not used |

These seven interrupt/test signal lines are precharged during every clock high period of the internal IMB clock signal (CLK) and are asserted during a clock low period. The scan-in and scan-out signal lines (SCANA and SCANB) each have separate scan clock enable signals (SCEA and SCEB respectively). This allows test module 18 to shift a different number of bits into the module under test through scan path A than it shifts into test module 18 through scan path B. The Activate-Circuit-Under Test (ACUT) signal line causes the module under test (MUT) to perform a particular function based upon control bits within the MUTs test register. The ACUT signal is a strobe signal which is asserted for a single discharge (clock low) period. Typically, a module's test register resides within the normal memory map of the module. Since the CPU 11 has no slave interface and no memory mapped registers, its test register is accessed serially by scanning. The CPUTR signal line is used to enable scanning of the CPU test register 8.

The Test Module 18

Initially, a general overview of test module 18 will be provided before a specific implementation of test module 18 illustrated in FIG. 2 will be discussed. Test module 18 supports three modes of testing: (1) manual mode; (2) automatic mode; and (3) continuous mode. In manual mode, an IMB master, such as CPU 11, supplies the data to be scanned into the MUT (sixteen bits at a time), and directly verifies the data scanned back from the MUT (sixteen bits at a time). This mode is used for applying specific input patterns to test module 18 and looking at expected predetermined output patterns. The scanning and activate-circuit-under-test activites are also directly controlled by the IMB master when using manual mode. Manual mode is also beneficial in providing extended controllability and visibility for user microcode development and debugging (e.g. debugging microcode in TPU 15).

In automatic mode the test module 18 utilizes a pseudorandom serial pattern generator (a nineteen bit, linear feedback shift register 38) to supply data to be scanned into the MUT, and uses a serial signature analyzer (a nineteen bit, linear feedback shift register 40) to compress the data scanned back from the MUT. This mode allows test module 18 to independently control the testing operation. Automatic mode may also be set up to repeat a "scan-in, activate the circuit under test, and scan out" sequence a specified number of times. In this repeated automatic mode, the pseudorandom pattern generator continues to generate a varying data pattern for each test, and the signature analyzer compresses resultant data returned throughout the series of tests. Thus the test presents different data with each iteration and the single resulting signature is derived from data returned during the entire test. At the completion of an automatic mode test (whether a single or a repeated test) a reset is caused to occur which brings the entire system to a known state and transfers control to CPU 11.

The third mode of test module 18 is a continuous mode. In the continuous mode, test module 18 only shifts data in from the module under test (MUT). This allows the verification of certain sequencers such as a baud rate counter (not shown) within serial interface 13. In verifying such a baud rate counter, the IMB master writes to the MUT's test register selecting the output of the baud rate counter to be coupled to the SCANB scan line during testing. The baud rate counter is also reset in order to synchronize the counter operation to the test. The IMB master then writes to test module 18 to start continuous mode testing which compresses the output of the baud rate counter using the signature analyzer of test module 18. Some period of time later, as for example controlled by a software timing loop, the IMB master stops continuous mode (by writing to test module 18) and the correct signature is verified.

Figure 2:
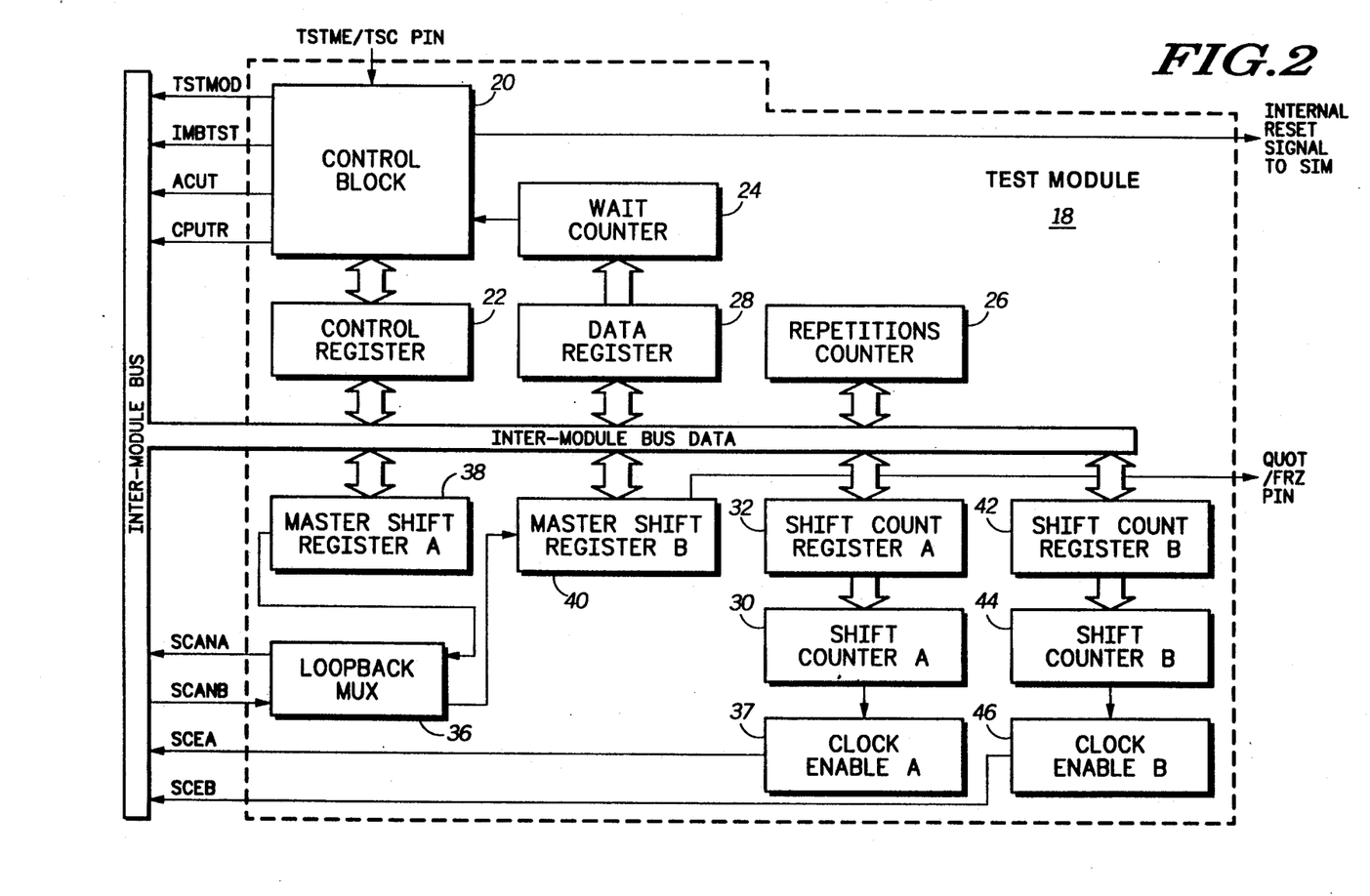
FIG. 2 is a block diagram of a test module which is part of the system integration module of FIG. 1.

Referring to FIG. 2, the test module 18 comprises shifters, counters, registers and associated control logic. A control block 20 of logic provides signals TSTMOD, IMBTST, ACUT and CPUTR to the IMB 12 and provides an internal reset signal to the system integration module 16. Control block 20 also has an input pin for receiving the TSTME/TSC signals. Control block 20 is bidirectionally connected to a control register 22 which is bidirectionally connected to an IMB data bus. A wait counter 24 is connected to control block 20. A repetitions counter 26 is bidirectionally connected to the IMB data bus as is a data register 28. Data register 28 is also connected to the wait counter 24. A loopback multiplexor 36 provides a SCANA signal to the IMB 12 and receives a SCANB signal from the IMB 12. A master shift register A, designated by number 38, is bidirectionally connected to the IMB data bus and has an output connected to an input of loopback multiplexor 36. An output of loopback multiplexor 36 is connected to a master shift B register, designated by number 40. Master shift register B 40 is bidirectionally connected to the IMB data bus as is a shift count A register 32 and a shift count register B 42. Master shift register B 40 provides an output wherein the least significant bit is signal QUOT. A multiplexor (not shown) functions to select either QUOT or a Freeze (FRZ) signal from the IMB data bus to output at a circuit output pin. An output of shift count register A 32 is connected to an input of a shift counter A 30 which has an output connected to an input of a clock enable A circuit 37. An output of shift count register B 42 is connected to an input of a shift counter B 44 which has an output connected to an input of a clock enable B circuit 46. Clock enable A circuit 37 provides a signal labeled SCEA to the IMB 12, and clock enable B circuit 46 provides a signal labeled SCEB to the IMB 12.

In operation, master shift register A (MSRA) 38 functions as a sixteen or nineteen bit shift-out register. Data is either shifted out onto the SCANA signal line, or into the loopback multiplexor 36. In manual mode, sixteen bit data is loaded in and serially shifted out, or in automatic mode, nineteen bit data is generated pseudorandomly, based on some initial seed value, and shifted out. In another form, the data may be provided independently of the mode of operation. The pseudorandom pattern generator is a linear feedback shift register implemented as shift register 38 with the feedback polynomial of:

$$X^{19}+X^5+X^2+X+1.$$

Master-shift-register B (MSRB) 40 functions as a sixteen/nineteen bit shift-in register. In manual mode, sixteen bit data is shifted in and read directly, or in automatic mode nineteen bit data is compressed using a signature analysis compression scheme. The signature analyzer is also a linear feedback shift register implemented as shift register 40 with the feedback polynomial of:

$$X^{19}+X^5+X^2+X+1.$$

Each of shift registers 38, 40 is independently controlled by shift counters 30 and 44, respectively. Shift-counter A 30 and shift-counter B 44 are count-down counters which independently control the number of bits shifted out and shifted in of the test module 18, respectively. The shift-counters 30 and 44 are loaded using the values stored in shift-count-register-A 32 and shift-count-register-B 42, respectively. Shift count registers 32 and 42 retain their written value which allows the shift lengths to be reused in further scanning. The shift-counters 30 and 44 control clock-enable-A 37 and clock-enable-B 46, respectively, which in turn respectively control the assertion of the Scan Enable A (SCEA) and Scan Enable B (SCEB) IMB signal lines. The scan enable signals control scanning by being asserted until the respective shift counter counts down to zero.

The repetitions counter (REPS) 26 supports the repeated automatic mode of operation. The number of "scan-in, activate-circuit-under-test, scan-out" iterations desired is written to repetitions counter 26. As each iteration is performed the repetitions counter 26 is decremented. When repetitions counter 26 reaches zero, the test is complete and a reset is caused to occur.

Test module 18 is set up and controlled via a number of programmable registers. The following discussion associated with FIG. 3 describes the programmable registers and control bits associated with test module 18 and provides an overview of the available test functionality.

Master Shift Register A (MSRA) 38

Figure 3:
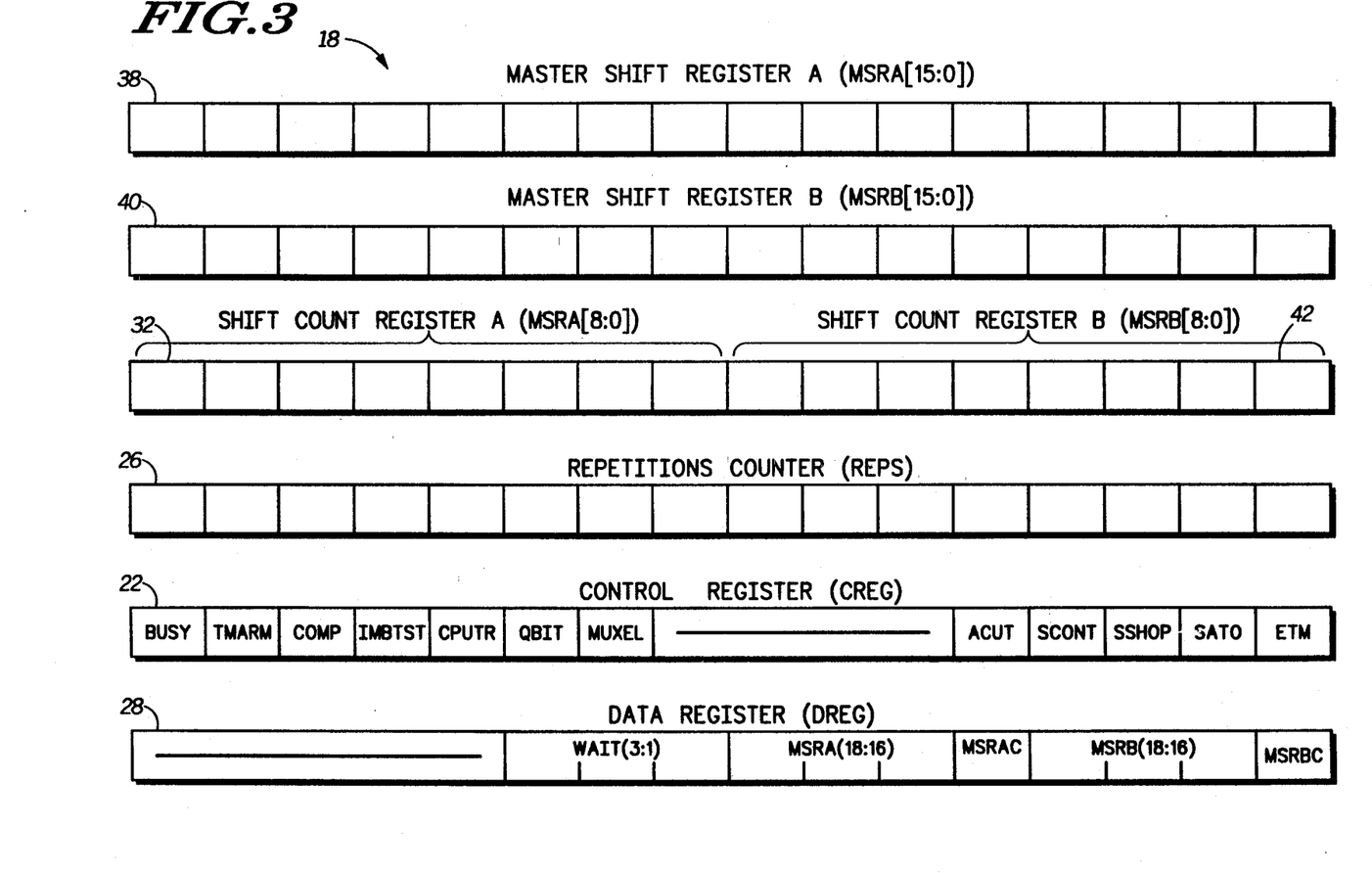
FIG. 3 is an organizational diagram showing programmable registers/control bits of the test module of FIG. 2.

This sixteen bit location allows read or write access to the least significant sixteen bits of the outgoing, nineteen bit Master-Shift-Register-A 38. When used as a pseudorandom pattern generator, the shift register can be optionally extended to nineteen bits using an additional field in data register 28 (DREG).

Master Shift Register B (MSRB) 40

The sixteen bit location allows read or write access to the least significant sixteen bits of the incoming, nineteen bit Master-Shift-Register-B 40. When used as a signature analyzer, the shift register can be optionally extended to nineteen bits using additional fields in data register 28.

Shift Count Register A (SCRA) 32

This eight bit register holds the shift count value for master-shift-register-A 38. This register 32 retains its value during shifting and a reset will clear this register.

Shift Count Register B (SCRB) 42

This eight bit register holds the shift count value for master-shift-register B 40. This register retains its value during shifting and a reset will clear this register.

Repetitions Counter (REPS) 26

The Reps Counter 26 is a sixteen bit counter that specifies the number of "shift-in, activate circuit under test, shift-out" iterations are to be performed in the repeated automatic mode of operation. Reset will clear this counter 26.

Test Submodule Control Register (CREG) 22

This sixteen bit register contains the BUSY, TMART, COMP, IMBTST, CPUTR, QBIT, MUXSEL, ACUT, SCONT, SSHOP, SATO, and ETM control bits. The functionality of these control bits is described below. The control bits labeled "Busy", "TMARM" and "COMP" are read-only status bits. Assuming the bits of control register 22 comprises two bytes, the upper byte, from the left end containing the Busy bit, is writeable only while in the test mode. The lower byte of control register 22 is writeable at anytime. The entire control register 22 may be read at any time.

ETM—Enter Test Mode Bit

This bit enables test mode when asserted. It can be written only once following a reset, and can only be asserted if the external TSTME pin is asserted.

SATO—Start Automatic Test Operation

This bit starts an automatic test mode operation. The test module 18 and the module under test must be properly set up prior to setting this bit. This bit is automatically cleared when the repetitions counter 26 decrements to zero.

SSHOP—Start Shifting Operation

This bit is used in manual mode and starts a shifting operation. The shifting operation ends and the SSHOP bit is cleared when both shift A counter 30 and shift B counter 44 are equal to zero.

SCONT—Start Continuous Operation

This bit is used in continuous mode and when set, the test module 18 continuously shifts data into master shift register B 40. Continuous operation ends when the bit is cleared.

ACUT—Activate Circuit Under Test

This bit is used with manual mode and causes the ACUT IMB signal line to be strobed. This bit always reads as negated.

MUXSEL—Multiplexer Select Bit

This bit selects either the $\overline{IRQ6}$ external interrupt pin, or the internal SCANB test line as the source for MSRB. This allows the external interrupt request pins to be used to test external devices. Port F (controlling the interrupt pins) must also be correctly configured in order to scan external devices. This bit can only be written in test mode.

QBIT—Quotient Bit

This bit selects the function of the external QUOT/FRZ pin. If the bit is asserted, the least significant bit of MSRB is output as the "quotient bit" signal, if the bit is negated the pin functions as the CPU "freeze" signal. This bit can only be written in test mode.

CPUTR—CPU Test Register 8

This bit controls the assertion of the CPUTR signal. When this bit is asserted, scanning is enabled into and out of the CPU test register 8. This bit can only be written in test mode. When this bit is negated, the CPU test register 8 is loaded from shift register 38 or 40 to prevent the bits from varying during shifting.

IMBTST—Intermodule Bus Test

This bit controls the assertion of the IMBTST signal. When this bit is asserted the IMB interrupt lines function as test signal lines as previously defined. When the bit is negated the master A and B shift registers 38 and 40 are connected to each other to facilitate testing of the shift registers themselves. This bit can only be written in test mode.

COMP—Compare Status Bit

This status bit signifies at the conclusion of the user self-test basic test that the correct signature was generated and that the test passed. The correct signature is stored in a mask programmable ROM in the test module 18 and will vary with structural variations of microcomputer 10 and microcode revisions. This status bit is read only.

TMARM—Test Mode Armed Status Bit

This bit signifies the state of the external $\overline{TSTME}$ pin. This status bit is read only.

BUSY—Test Module 18 Busy Status Bit

This status bit signifies that the test module 18 is busy when an automatic test operation, shifting operation, or continuous operation is in progress. This status bit is read only.

Test Module 18 Data Register 28 (DREG)

This sixteen bit register contains the WAIT(3:1), MSRA(18:16), MSRAC, MSRB(18:16), and MSRBC control bits and fields. The functionality of these control bit fields is described below.

WAIT (3:1)—Wait counter presets

These bits program the delay time between automatic test shifting sequences. This delay time allows the module under test (MUT) to respond to the ACUT signal line strobe. The next shifting operation will not begin until the delay period is over. The following table shows the programmable delays available.

| wait | delay (clocks) |
|---|---|
| 000 | 2 |
| 001 | 4 |
| 010 | 6 |
| 011 | 8 |
| 100 | 10 |
| 101 | 12 |
| 110 | 14 |
| 111 | 16 |

MSRA(18:16)—Master Shift Register A 38 Bits 18 thru 16

These bits are the three most significant bits of master shift register A 38, and are used only with serial pseudorandom pattern generation.

MSRAC—Master Shift Register A 38 Configuration

This bit determines whether master shift register A 38 is configured as a nineteen bit serial pseudorandom pattern generator or as a sixteen-bit shift register.

MSRB(18:16)—Master Shift Register B 40 Bits 18 thru 16

These bits are the three most significant bits of master shift register B 40, and are used only with serial signature analyzing.

MSRBC—Master Shift Register B 40 Configuration

This bit determines whether master shift register B 40 is configured as a nineteen bit serial signature analyzer or as a sixteen bit shift register.

REPS Counter—Repetitions Counter 26

This count down register counter 26 determines the number of "shift-in, activate circuit under test, shift-out" iterations are to be automatically performed.

Figure 4:
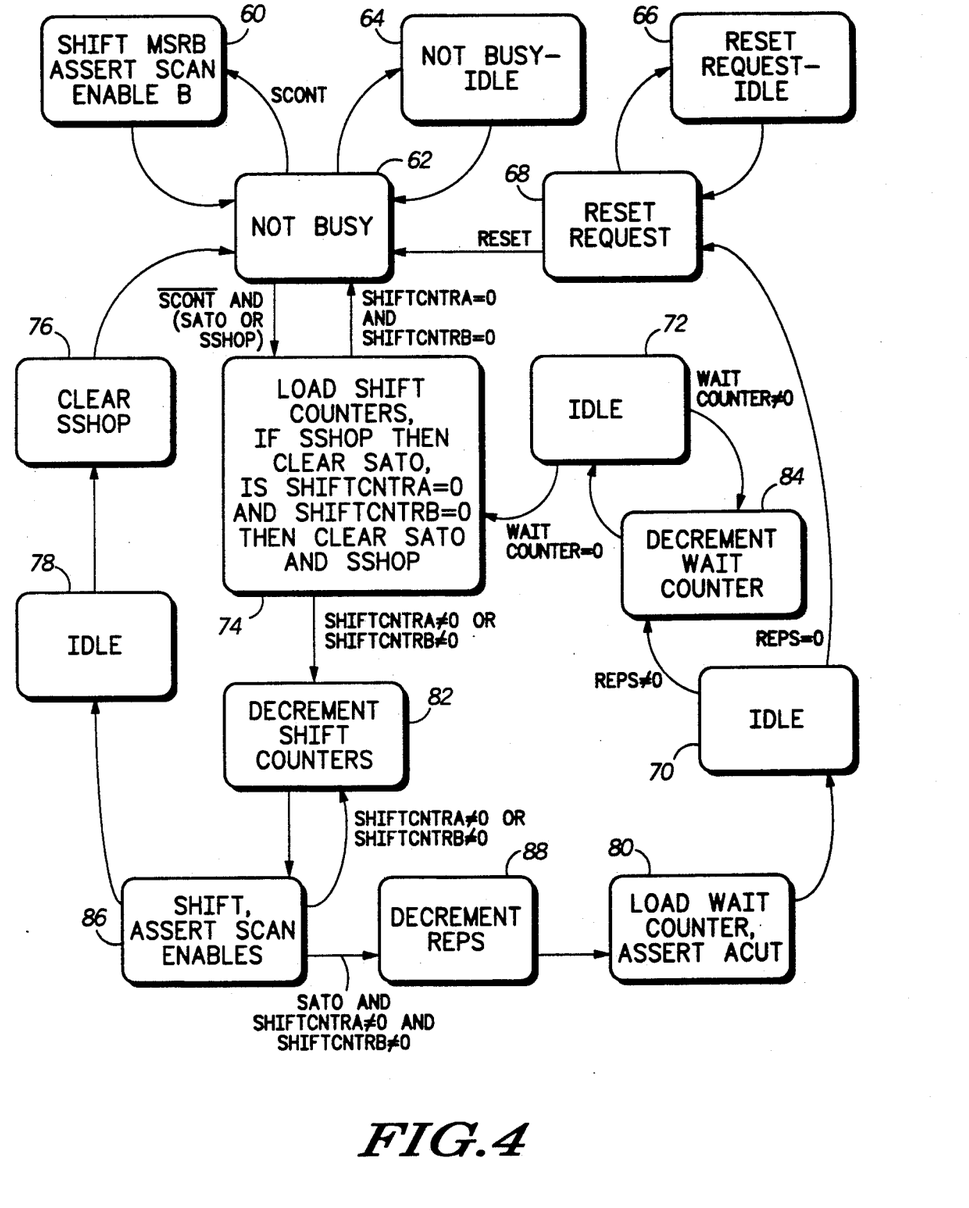
FIG. 4 is a state diagram depicting the operation of the test module of FIG. 1.

FIG. 4 shows a state diagram for the test module 18. The state machine is defined such that: (A) one of the following states: state-82, state-88, state-78, state-70, state-66, state-72, or state-62 occurs during a clock high period, and (B) one of the following states: state-74, state-60, state-86, state-80, state-76, state-68, state-84, or state-64 occurs during a clock low period. As such, state transitions occur at both rising and falling clock edges. State-62 is the state entered at reset. If the SCONT bit of control register 22 is asserted then state-62 transitions to state-60. During state-60, the SCEB signal line is asserted and a single bit is shifted into MSRB 40. If the SATO or SSHOP bits are asserted and bit SCONT is negated, then state-62 transitions to state-74. Otherwise, state-62 transitions to state-64. State-64 and state-60 both transition back to state-62. While in state-74, shift counters SCA 30 and SCB 44 are loaded from the shift count registers SCRA 32 and SCRB 42, respectively. Also, in state-74, if the SSHOP bit is asserted then the SATO bit is cleared, and if both shift counters 30 and 44 are equal to zero, then both the SATO and SSHOP bits are cleared. State-74 subsequently transitions to state-82 where SCRA 32 and SCRB 42 are decremented. Once a shift counter reaches zero it is no longer decremented. State-82 transitions to state-86 where master shift register A 38 shifts out a single bit if shift counter A 30 is non-zero, and master shift register B 40 shifts in a single bit if shift counter B 44 is non-zero. The scan clock enable signal lines, SCEA and SCEB, are also asserted if the respective shift counters SCRA 30 and SCRB 44 are non-zero. State-86 transitions back to state-82 if either shift counter A 30 or SCB 44 is non-zero. If the SATO bit of control register 22 is asserted and shift counter A 30 and shift counter B 44 are both zero, then state-86 transitions to state-88. Otherwise, state-86 transitions to state-78 which subsequently transitions to state-76, where the SSHOP bit is cleared, which subsequently transitions to state-62. During state-88, the repetitions counter 26 is decremented. State-88 subsequently transitions to state-80. During state-80 the wait counter 24 is loaded, and the ACUT signal line is asserted for one-half of a clock period. State-80 transitions to state-70. If the repetitions counter 26 is non-zero, then state-70 transitions to state-84 which decrements the wait counter 24. Otherwise, state-70 transitions to state-68 where a reset request is issued to the SIM 16. Until a reset occurs, state-68 transitions to state-66, which transitions back to state-68. When a reset does occur, state-62 is entered, which effectively transitions from state-68 to state-64. Discussing state-84 again, state-84 transitions to state-72. If the wait counter 24 is non-zero, state-72 transitions back to state-84 where the wait counter 24 is decremented. If the wait counter 24 is equal to zero, then state-72 transitions to state-74.

Reiterating, the continuous mode is supported by the looping between state-60 and state-62. Setup for scanning is handled by state-74. The scanning for manual and automatic modes occurs when looping between state-82 and state-86. Manual mode is concluded by transitioning through state-78 and state-76 which clears the SSHOP bit. Automatic mode is supported by state-88 which decrements the repetitions counter 26, state-80 which loads the wait counter 24, state-70 which tests the repetitions counter 26, state-68 and state-66 which request a reset at the conclusion of automatic mode, and state-84 and state-72 which implement the wait delay.

The Time Processing Unit 15 Testing

The TPU (Time Processing Unit) 15 is a peripheral module within microcomputer 10 which is tested using scan paths. The six scan paths implemented within the TPU 15 (but not shown) are: (1) the micro-program-counter ($\mu$PC) scan path, (2) the micro-instruction-register ($\mu$IR) scan path, (3) the branch PLA (Programmable Logic Array) scan path, (4) the $\mu$PC breakpoint register scan path, (5) the channel breakpoint register scan path, and (6) the scheduler PLA scan path. These scan paths allow complete structural testing of the ROM, the decode PLA, the branch PLA, and the scheduler PLA and can also aid in functional testing of the execution unit, the bus interface, and the parameter RAM.

The TPU is a microcode based peripheral used to process time related tasks. The TPU can execute microcode out of either its internal ROM (Read Only Memory) or out of memory module 14. When executing out of memory module 14, the microcode data is supplied to the TPU using a private bus between the TPU and memory module 14 so that IMB 12 is free to service other data transfers. Since the TPU is user microprogrammable, the scan paths are also designed to support microcode development. For example, the $\mu$PC breakpoint register and the channel breakpoint register are specifically designed to trap the TPU microcode execution as an aid in debugging. These registers are only accessible through the serial scan paths of the TPU.

Figure 5:
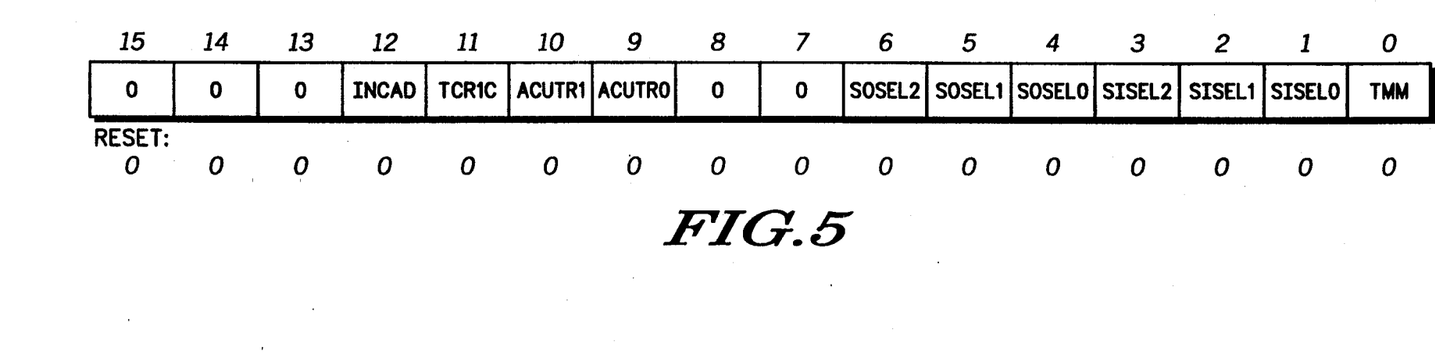
FIG. 5 is an organizational diagram of a test register of the time processing unit (TPU) of FIG. 1.

The TPU test register 9 contains scan multiplexer control bits and ACUT response bits. It also includes a bit which allows its TCR1 timer to be clocked from an external pin thereby providing complete timer control to the tester. Another bit moves the module to a different location in the memory map to test the address decoding of the TPU and other modules and to ensure that one module does not respond in another module's address space.

The TPU testing operations are controlled by the TPU test register 9. FIG. 5 shows the test register 9 and the associated control bits. The function of these bits is described below.

INCAD—Increment Address

Forces the $\mu$PC to increment once for each assertion of the ACUT signal line. This can be used to sequentially dump the micro ROM.

TCR1C—TCR1 Clock

Selects TCR1 time reference clock source, either internal or external.

ACUTR(1:0)—Activate Circuit Under Test Response

Specifies the action to be taken in response to the assertion of the ACUT signal line.

| ACUTR | TPU Response |
|-------|--------------|
| 00 | None |
| 01 | Run One Microcycle |
| 10 | Assert Scheduler end-of-time-slot signal. |
| 11 | Reserved |

SOSEL(2:0)—Scan Out Select

Selects the TPU output scan path to be connected to the SCANB signal line.

SISEL(2:0)—Scan Input Select

Selects the TPU input scan path to be connected to the SCANA signal line.

| SOSEL/SISEL | Scan Path |
|-------------|-----------|
| 000 | None |
| 001 | Micro PC |
| 010 | Micro Instruction |
| 011 | Branch PLA |
| 100 | Micro PC Breakpoint |
| 101 | Scheduler PLA |
| 110 | Channel Breakpoint |
| 111 | Reserved |

TMM—Test Memory Map

Places the TPU module at a fixed memory map location, which allows the development of test patterns that are independent of the system memory map.

The Central Processing Unit Testing

The CPU contains two separate scan paths. One scan path includes the inputs and outputs of the decode PLAs and the micro program counter ($\mu$PC), and the second scan path scans the microcode ROM outputs.

The microcode ROM is made up of the micro-ROM and the nano-ROM control stores. Is is tested by shifting a 10-bit address into the microprogram counter ($\mu$PC) and then activating the clocks in the CPU for one microcycle. During the microcycle, the new ROM outputs (one hundred-fifty bits) are latched into the ROM output latches. The ROM outputs are then shifted out to the test module 18 in the SIM 16. The μPC is part of the PLA scan path. Therefore, testing the ROM requires shifting data into the PLA scan path and shifting output data out of the ROM scan path.

The instruction decode PLAs are a group of PLAs with the group having twenty-two inputs and twenty-seven outputs. A scan path runs through nineteen of the inputs with the other inputs being controlled by three bits in the CPU test register 8. This arrangement requires that the PLA be tested in eight separate sequences. This arrangement allows the PLAs to be deterministically or pseudo-exhaustively tested using the Serial Pattern Generator (a nineteen bit linear feedback shift register) in test module 18. During the testing of the PLAs, the μPC captures the output of the decode PLAs and subsequently the information is shifted to test module 18.

Figure 6:
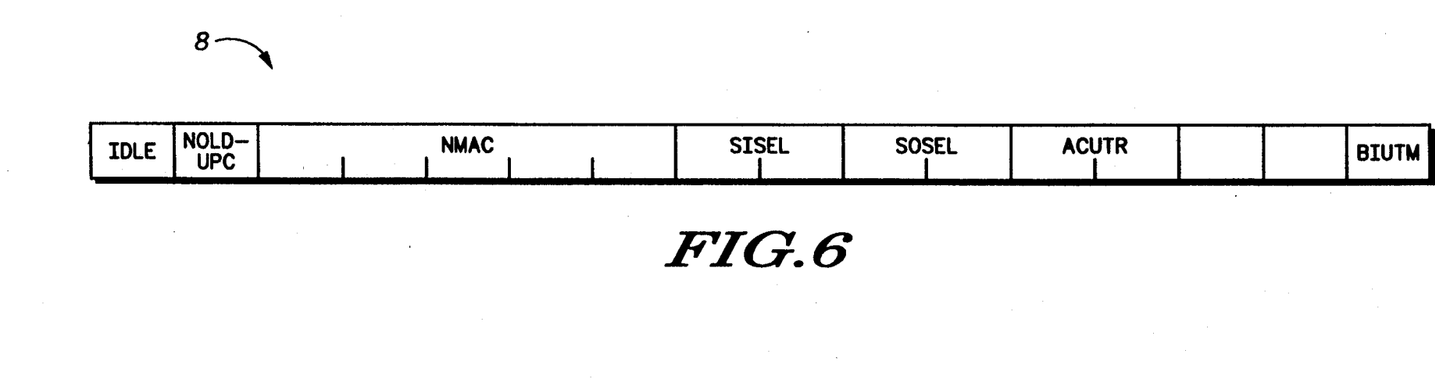
FIG. 6 is an organizational diagram showing a test register of the central processing unit of FIG. 1.

The CPU 11 is a "master only" module without a slave interface on the IMB. Other modules which are masters typically have a slave interface which allow them to be controlled by the CPU. To avoid having to include a slave interface on CPU 11 just for testing, the CPU test register 8 is accessed serially using the IMB scan lines and under the control of the test module 18. The CPU test register 8 contains several bits to control various aspects of CPU testing. FIG. 6 shows the locations of the control bits within the CPU test register 8, and their control operation is further described below.

IDLE

Causes CPU 11 to go idle except in response to the assertion of ACUT as provided for by the ACUTR field. The IDLE bit causes the CPU micromachine to enter wait states. This bit also causes the Bus Unit to stop prefetching and causes the microengine to ignore all other waits especially during ACUTR response.

NOLDUPC—No Load μPC

Inhibits the loading of the μPC from normal PLA or microcode ROM sources. This bit is disabled when ever the NMAC field is nonzero.

NMAC (4:0)—Next Micro Address Control

This field configures the micromachine's Next Micro Address (NMA) block for testing. When NMAC is nonzero the input latches of the PLAs are kept from being updated once a value is scanned into them.

| NMA Control Bits | Resulting Operation |
|---|---|
| 00000 | Normal Operation |
| 00010 | Force A0 load of μPC |
| 1wxyz | Substitute wxyz as PLA input terms |

SISEL(1:0)—Scan In Select

Determines which scan path to connect to the SCANA signal line as scan input.

SOSEL(1:0)—Scan Out Select

Determines which scan path to connect to the SCANB signal line as scan output.

| SCAN-IN/SCAN-OUT | Scan Path |
|---|---|
| 00 | No Scan Path Enabled |
| 10 | NMA Scan Path Enabled |

| SCAN-IN/SCAN-OUT | Scan Path |
|---|---|
| 11 | ROM Scan Path Enabled |

ACUTR(1:0)—ACUT (Activate Circuit Under Test) Response

This field determines the microengine response to the assertion of the ACUT signal line.

| ACUTR(1:0) | Response to ACUT |
|---|---|
| 00 | No Response |
| 01 | Run One Microcycle |
| 10 | Run Two Microcycles |
| 11 | Strobe PLAs according to NMAC |

BIUTM—Bus Interface Unit Test Mode

This bit causes the Bus Interface Unit to ignore all micromachine initiated bus cycle requests during testing.

Built-In Self-Test

Figure 7A:
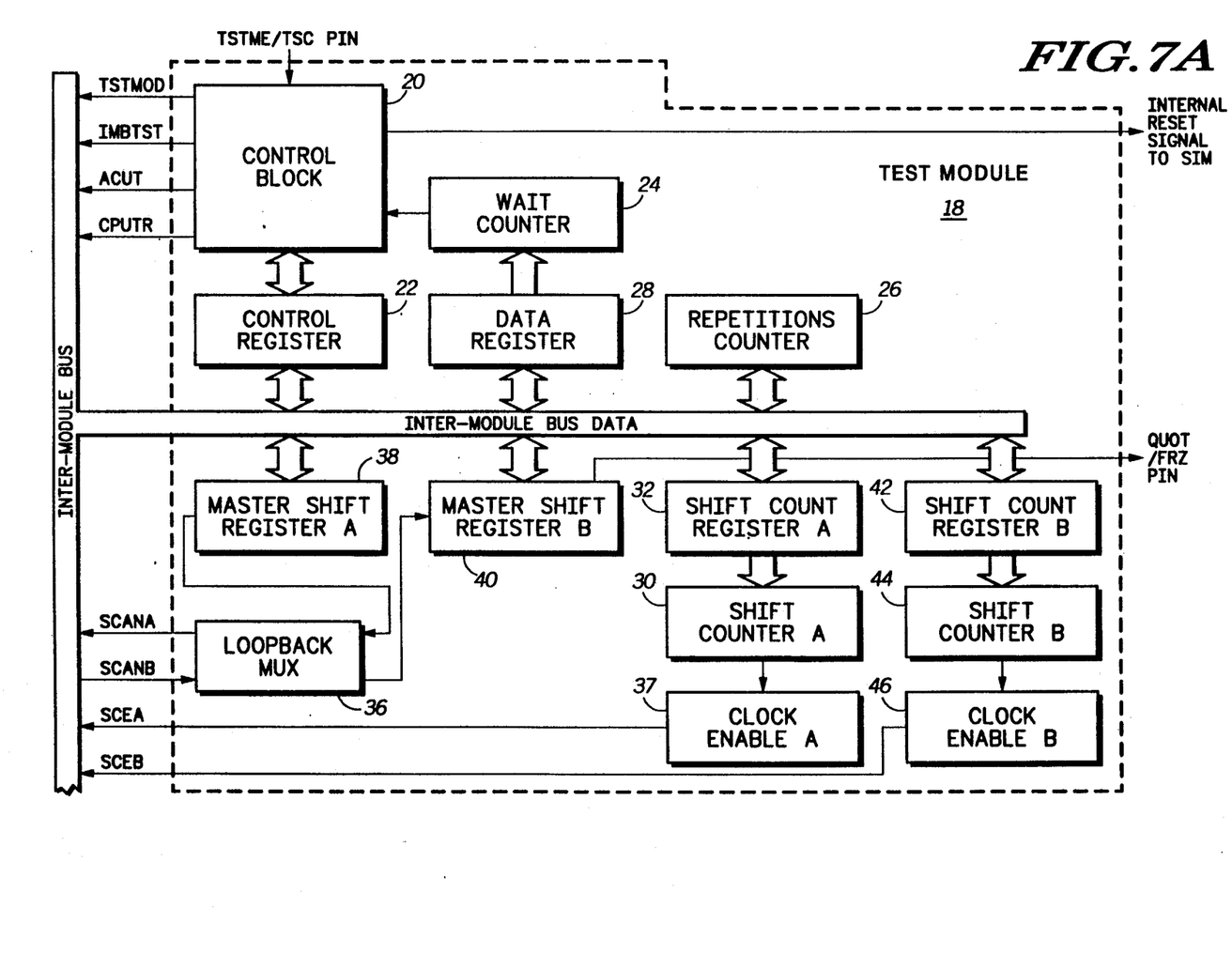
FIGS. 7A and 7B when combined are a block diagram of the test structures of the test module and central processing unit of FIG. 1.
Figure 7B:
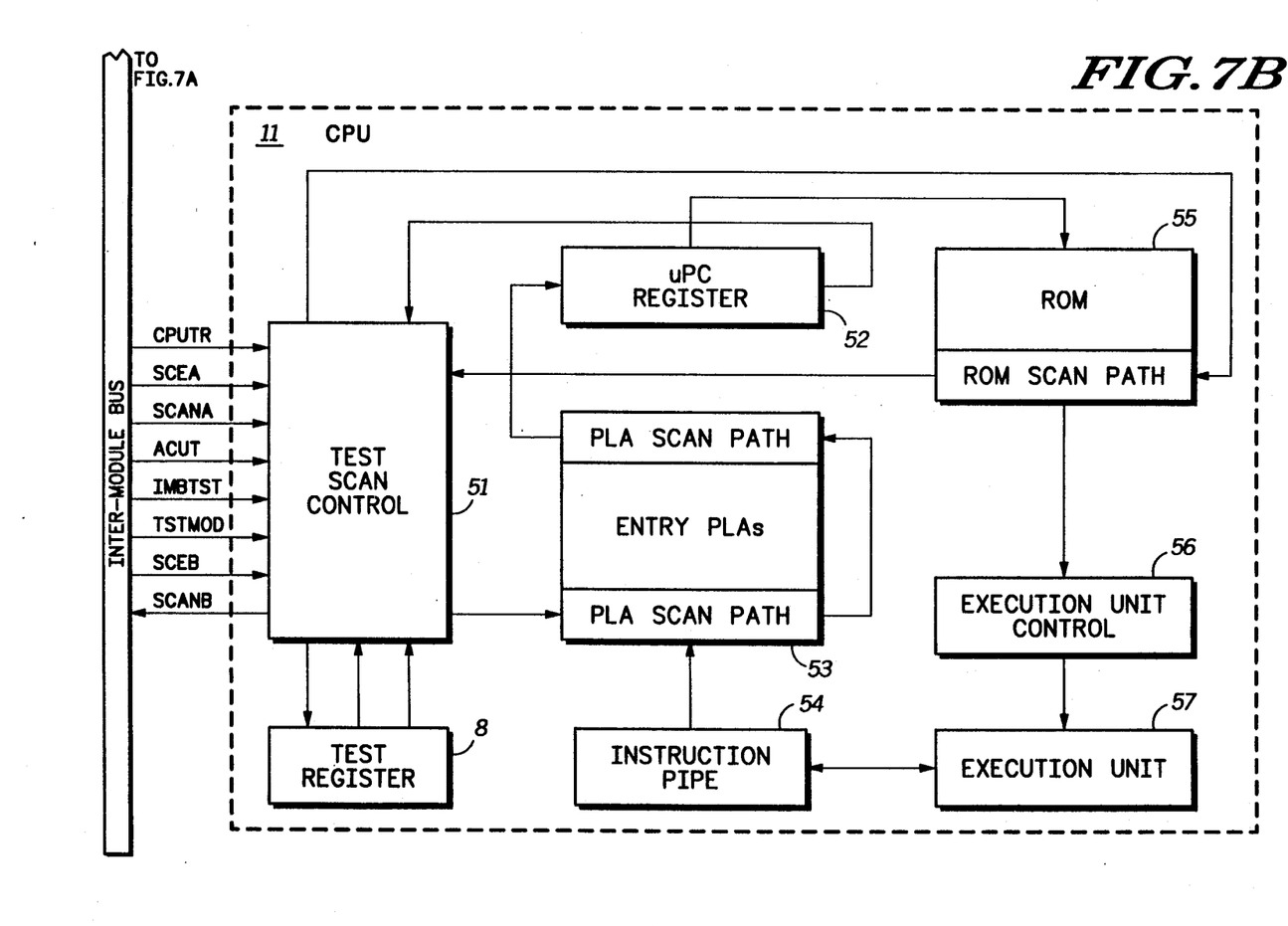

Shown in FIG. 7 is an operational illustration of a Built-In Self-Test (BIST) capability for microcomputer 10 to verify its own functionality. In this embodiment, the built-in self-test (BIST) capability consists of setting up and running automatic scan operations on each section of circuitry to which it is applicable (i.e. ROMs and PLAs in the CPU and TPU) and verifying that the results are correct. The BIST executed under the control of a CPU program which sets up the MUT and test module 18. The test module 18 then scans out the stimulus pattern, the circuit under test is activated, and the results are scanned out. When testing modules other than CPU 11, manual mode, automatic mode, or repeated automatic mode can be used. Manual mode has been discussed in detail earlier, thus we proceed with a discussion of the use of automatic mode. When testing the CPU module, automatic mode or repeated automatic mode is used. At the conclusion of automatic mode, a reset occurs.

The preferred embodiment contains a "reset-status-register" (not shown) that can be read to determine which of seven "sources" caused the most recent reset. These seven resetting sources include: (1) an externally initiated reset, (2) powerup reset, (3) a software watchdog timeout, (4) the CPU halt monitor, (5) a loss of clock detect, (6) the CPU executing a RESET instruction, or (7) a test submodule initiated reset. After a reset has occurred, CPU 11 can read the reset-status-register and determine what source caused the reset, and if any particular action should be taken.

When initating a built-in self test sequence, the CPU 11 initializes some BIST status location (i.e. either a memory location or a CPU register). At the conclusion of each automatic operation a reset will be caused by test module 18 and the reset handler software will start executing. The reset handler reads the reset-status-register, determines that the reset was caused by the test submodule, and jumps to the BIST software routine. The BIST routine reads the BIST status location (which should contain the value written prior to reset) and determines which test just completed. The BIST routine can either verify the single test result, save the result for future verification, and/or compress it with the results from previous tests. The BIST routine then continues with the next test by appropriately setting up the MUT's test register, the test module 18, and initiating the next automatic test. At the conclusion of self testing, and after the results have been verified, the BIST returns control back to the normal control program or operating system program.

FIGS. 7A and 7B together show a block diagram of test module 18 and CPU 11 coupled via the IMB. FIG. 7A should be placed above FIG. 7B as noted in FIG. 7B. Test module 18 is illustrated exactly as shown in FIG. 2 and therefore will not be again detailed by numbers. CPU 11 generally comprises test scan control circuitry 51, test register 8, a $\mu$PC register 52, entry PLAs 53, an instruction pipeline 54, a ROM 55, an execution unit control 56 and an execution unit 57. Test scan control circuit 51 is connected to the IMB for receiving a plurality of signals labeled CPUTR, SCEA, SCANA, ACUT, IMBTEST, TSTMOD, and SCEB and providing a signal labeled SCANB. Test scan control circuit 51 has an output connected to a ROM 55 scan-in path of ROM 55, and a scan-out path of ROM 55 is connected to test scan control circuit 51. Test scan control circuit 51 has inputs and an output connected to test register 8. The $\mu$PC register 52 has a control output connected to the test scan control circuit 51 and a control input connected to a PLA scan out path of the entry PLAs 53. An output of test scan control circuit 51 is connected to a PLA scan in path of entry PLAs 53. A ROM scan out path of ROM 55 is connected to test scan control circuit 51. A bidirectional data path is connected between the instruction pipe 54 and execution unit 57. Instruction pipe 54 is connected to entry PLAs 53 which is connected to the $\mu$PC register 52. The $\mu$PC register 52 has an output connected to ROM 55 which has an output connected to the execution unit control 56. An output of execution unit control 56 is connected to execution unit 57.

In operation, CPU 11 and test module 18 function to implement a BIST operation which dumps the CPU's microcoded ROM 55. In this example, CPU 11 comes out of reset and starts executing its normal system reset code. In that code it reads the reset status register which is within SIM 16 (not shown) and which indicates the source of the most recent reset. The program then decides to enter test mode and configure test module 18 for the initial or next segment of the built-in-self-test. In this case, the segment tests the CPU microcoded ROM 55.

The CPU program sets up the CPU test register 8 for the microcoded ROM test by configuring test module 18 for a shifting operation which shifts the data from test module 18 to the CPU test register 8. For this, SCRA is set to sixteen bits (the length of the CPU test register 8) and MSRA is loaded with the value to be shifted into the CPU test register 8. The shift is started by a write to the test module control register 22 which sets the Start Shifting Operation (SSHOP) bit and the CPU Test Register Scan (CPUTR) bit. The CPU test register 8 is loaded in a double buffered fashion. After the shift, the value to be loaded into the CPU test register 8 is held in the test register scan path. The test register 8 itself is loaded when the CPUTR bit in the control register 22 is cleared which negates the CPUTR IMB signal line.

For this test the CPU test register 8 is loaded with the conventional hexadecimal value represented by C0B5$_{16}$ such that: (1) the IDLE bit causes the CPU to enter wait states, (2) NOLDUPC inhibits loading of the $\mu$PC register 52 from the entry PLAs 53 or ROM 558 (3) the BIUTM bits are set so as to prevent bus cycles from being initiated during testing, (4) the SISEL field selects the NMA scan path for scanning into, (5) the SOSEL field selects the ROM scan path for scanning out from, (6) the NMAC field selects normal operation, and (7) the ACUT response field is set for running one microcycle.

Next, the CPU program sets up test module 18 for the automatic operation which verifies the CPU microcoded ROM 55. This time, SCRA is loaded with the hexadecimal value 2D$_{16}$ representing the number of bits (forty-five) to shift in and SCRA is loaded with the value 96$_{16}$ representing the number of bits (one hundred fifty) to shift out of the microcoded ROM 55 scan path. MSRA and MSRB are respectively configured as a serial pattern generator and a serial signature analyzer and are initialized with the proper nineteen bit seeds by a writing to the DREG, MSRA, MSRB registers. The write to DREG also sets the preset value of the wait counter 24 to three. The repetitions counter 26 is next written to a value indicating the number of times to read a word from the microcoded ROM 55.

The test module 18 is now configured for the microcoded ROM test. The test is started by writing to test module 18 CREG and simultaneously setting the SSHOP bit and clearing the CPUTR bit. This causes the value in a CPU test register shifter to be loaded into the CPU test register 8 and starts the automatic scan operation. This effectively passes control from the CPU 11 to the test module 18 and the CPU 11 is idled in order to be tested. The test module automatic operation then scans forty-five bits into the $\mu$PC register 52 scan path and one hundred fifty bits out of the microcoded ROM 55 scan path.

After the shifting is over, test module 18 asserts the ACUT line and waits the amount of time allotted by the preset value of wait counter 24. The repetitions counter 26 is the decremented. When the repetitions counter 26 decrements to zero, a test reset is requested by the test module 18 hardware. The results of this automatic operation now reside in MSRB of the test module 18, ready to be interrogated after the CPU 11 comes out of reset. The first one hundred fifty bits scanned out of the CPU 11 will represent whatever value was left by the last CPU instruction, the last forty-five bits scanned into the CPU 11 will be of no consequence.

By now it should be apparent that there has been provided a data processor test architecture in which there are various modules in the processing system and a centralized test module which performs scan based testing. Each module has a test register associated with it that is writeable only while in a special test mode. The special test mode is signified by the assertion of an IMB TSTMOD signal. The test register is part of the module's memory map and controls the selection of scan paths or other test functions when testing commences. Scan paths run throughout the module to enhance testability, and these paths are coupled to the centralized test module by signal lines on the IMB. The centralized test module serially scans in a particular stimulus pattern, exercises a predetermined module under test, and scans out a resultant pattern. The stimulus pattern may be loaded into the centralized test module a word at a time by an IMB bus master (e.g. a CPU) or the patterns may be generated internally within the centralized test module by a pseudorandom pattern generator. For the pseudorandom pattern generator, the seed value is supplied by the IMB master. The module is exercised by the assertion of an Activate Circuit Under Test (ACUT) signal line for a fixed duration of clocks. The resultant pattern can be read a word at a time by the IMB bus master or the centralized test module can compress the result via a signature analyzer. The IMB master then reads the resultant compressed signature and verifies its correctness. The scan-in and scan-out data lengths are separately controlled and can be of different lengths. For self-test, the CPU under software control can load various patterns, activate a module under test, and examine the results. For the CPU to control its own testing, a CPU test register is provided which is writeable thru a scan path since a CPU does not have any memory mapped registers. The CPU can provide a seed for scanning and initiate a test. At the conclusion of the test, the centralized test module will cause a reset to occur which will reset the CPU. The CPU will then check the reset status register and observe that the centralized test module caused the reset. The resultant signature is then checked. The test architecture allows slave modules to be almost completely tested without CPU interaction thereby significantly enhancing system performance. The user self-testing feature taught herein functions by a joint action of hardware and software. The hardware is the test module 18 and the software is a self-test program executed by CPU 11. The user self-test can cover all areas of a system with scan paths. Since the self-test is partially software, it is well suited for inclusion in a larger diagnostic program and greatly improves the coverage of the normal diagnostic program since the areas it tests are typically very difficult to test with just functional instructions. Therefore, the self-test function provides an automatic verification of many large circuit modules within a data processing system while maintaining flexibility of being able to use scan paths which access the modules for diagnostic and debugging purposes.

While the present invention has been shown and described with reference to a particular embodiment thereof, various modifications and changes thereto will be apparent to those skilled in the art and are within the spirit and scope of the present invention.

We claim:

1. In a data processing system having a plurality of circuit portions coupled via a communication bus wherein a predetermined one of said circuit portions operates in one of a data processing mode of operation for implementing a first plurality of predetermined data processing functions and a test mode of operation for testing the predetermined circuit portion, a test architecture of the data processing system comprising:
   a test storage means in the predetermined circuit portion and coupled to the communication bus, the test storage means storing control information which is used to control the predetermined circuit portion during the test mode of operation;
   a bus master coupled to the communication bus for implementing a second plurality of predetermined data processing functions, the bus master selectively asserting control of the communication bus by providing a control signal to the predetermined circuit portion which places the predetermined circuit portion in the test mode of operation the bus master also providing the control information to the test storage means; and
   a test module coupled to the communication bus for performing a test of the predetermined circuit portion in response to the bus master by: (1) scanning an input operand of a first predetermined bit length into the test storage means via a first conductor of the communication bus in response to a first scan enable signal provided by the test module to the predetermined circuit portion via a second conductor of the communication bus; and (2) scanning an output operand of a second predetermined bit length out of the test storage means via a third conductor of the communication bus in response to a second scan enable signal provided by the test module to the predetermined circuit portion via a fourth conductor of the communication bus, the first predetermined bit length having a different magnitude than the second predetermined bit length, each of the first, second, third, and fourth conductors being used for another predetermined function when the data processing system is not in the test mode of operation;
   said bus master being able to continue implementing the second plurality of predetermined data processing functions after providing the control signal and concurrent with the test module performing the test of the predetermined circuit portion.

2. The data processing system of claim 1 wherein the control signal is provided by the bus master by writing an operand from the bus master to the test module.

3. The data processing system of claim 1 wherein said bus master comprises a central processing unit wherein said data processing system is contained within a single integrated circuit.

4. The data processing system of claim 3 wherein said central processing unit comprises a test register used solely for a predetermined test of the central processing unit, the predetermined test of the central processing unit being initiated by the central processing unit.

5. The data processing system of claim 4 wherein said central processing unit initiates the predetermined test in response to execution of software.

6. The data processing system of claim 4 wherein said predetermined test of the central processing unit begins only after both generation of the control signal indicating that the central processing unit is to be tested and a subsequent write operation to the test register of the central processing unit of an operand.

7. A method of implementing a test architecture in a data processing system having a plurality of circuit portions coupled via a communication bus, a predetermined one of the plurality of the circuit portions operating in one of a data processing mode of operation for implementing a first plurality of predetermined data processing functions and a test mode of operation for testing the predetermined circuit portion, comprising the steps of:
   providing a test storage means in the predetermined circuit portion, the test storage means being coupled to the communication bus and storing control information which is used to control the predetermined circuit portion;
   coupling a bus master to the communication bus, the bus master implementing a second plurality of data processing functions and asserting control of the communication bus by providing a control signal to the predetermined circuit portion which places the predetermined circuit portion in the test mode of operation, the bus master also providing the control information to the test storage means;

coupling a test module to the communication bus for performing a predetermined test of the predetermined circuit portion by scanning an input operand of a first predetermined bit length into the test storage means via a first conductor of the communication bus in response to a first scan enable signal provided by the test module to the predetermined circuit portion via a second conductor of the communication bus, and scanning an output operand of a second predetermined bit length out of the test storage means via a third conductor of the communication bus in response to a second scan enable signal provided by the test module to the predetermined circuit portion via a fourth conductor of the communication bus, the first predetermined bit length having a different magnitude than the second predetermined bit length to be able to scan operands of differing bit lengths with the test storage means, and each of the first, second, third, and fourth conductors being used for another predetermined function when the data processing system is not in the test mode of operation; and continuing implementing the second plurality of data processing functions with said bus master concurrent with the test module performing the test of the predetermined circuit portion.

8. The method of claim 7 further comprising the step of:

implementing the bus master as a central processing unit of the data processing system.

* * * * *